United States Patent
Shih et al.

(10) Patent No.: US 7,976,641 B1
(45) Date of Patent: Jul. 12, 2011

(54) EXTENDING STORAGE TIME OF REMOVED PLASMA CHAMBER COMPONENTS PRIOR TO CLEANING THEREOF

(75) Inventors: Hong Shih, Walnut, CA (US); Qian Fu, Fremont, CA (US); Tuochuan Huang, Saratoga, CA (US); Raphael Casaes, Oakland, CA (US); Duane Outka, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1067 days.

(21) Appl. No.: 11/239,396

(22) Filed: Sep. 30, 2005

(51) Int. Cl.
*B08B 17/04* (2006.01)
*B08B 3/04* (2006.01)
*B08B 3/08* (2006.01)

(52) U.S. Cl. .................. 134/41; 134/38; 134/4; 134/42; 427/154

(58) Field of Classification Search .................. 134/10, 134/26, 28, 36, 41, 4, 38; 427/154; 156/345.27
See application file for complete search history.

(56) References Cited

U.S. PATENT DOCUMENTS

| | | | |
|---|---|---|---|
| 5,833,726 A * | 11/1998 | Kinkead et al. .................. 55/356 |
| 6,171,438 B1 * | 1/2001 | Masuda et al. ............ 156/345.27 |
| 6,311,001 B1 * | 10/2001 | Rosine .......................... 385/120 |
| 6,685,012 B2 * | 2/2004 | Bowden et al. ............. 206/213.1 |
| 6,776,873 B1 | 8/2004 | Sun |
| 6,954,978 B1 * | 10/2005 | Crowder et al. ............ 29/603.03 |
| 7,052,553 B1 * | 5/2006 | Shih et al. .......................... 134/1 |
| 2002/0086118 A1 * | 7/2002 | Chang et al. .................. 427/447 |
| 2002/0139388 A1 * | 10/2002 | Chebi et al. ..................... 134/1.3 |
| 2003/0134040 A1 * | 7/2003 | Fusaro et al. .................. 427/282 |
| 2004/0002221 A1 * | 1/2004 | O'Donnell et al. ........... 438/710 |
| 2004/0023047 A1 * | 2/2004 | O'Donnell et al. ........... 428/472 |
| 2004/0259356 A1 * | 12/2004 | Toda et al. ..................... 438/689 |
| 2005/0150866 A1 | 7/2005 | O'Donnell et al. |
| 2005/0161061 A1 | 7/2005 | Shih et al. |
| 2005/0274320 A1 * | 12/2005 | Murugesh et al. ............ 118/715 |

OTHER PUBLICATIONS

MIL-A-8625C, Military Specification, "Anodic Coatings for Aluminum and Aluminum Alloys", Apr. 25, 1988, pp. 1-23.
Mansfeld et al., "Evaluation of Corrosion Behavior of Coated Metals with AC Impedance Measurements", The Journal of Science and Engineering, 1982, pp. 478-485, vol. 38, No. 9, National Association of Corrosion Engineers, Sep. 1982.
Hoar et al., "The Sealing of Porous Anodic Oxide Films on Aluminum", Electrochimica Acta., 1962, pp. 333-353, vol. 7, Pergamon Press Ltd, Northern Ireland.
Hitzig et al., "AC-Impedance Measurements on Porous Aluminium Oxide Films,". Corrosion Science, 1984, pp. 945-952, vol. 24, No. 11/12, Pergamon Press Ltd., Great Britain.

(Continued)

*Primary Examiner* — Michael Kornakov
*Assistant Examiner* — Natasha Campbell
(74) *Attorney, Agent, or Firm* — Buchanan Ingersoll & Rooney PC

(57) ABSTRACT

A method of extending storage time prior to cleaning a component of a plasma chamber is provided. The method comprises removing the component from the chamber, covering a thermal spray coating on the component while the surface is exposed to atmospheric air, storing the component, optionally removing the covering, and optionally wet cleaning reaction by-products from the thermal spray coating. Alternatively, instead of, or in addition to covering a thermal spray coating on the component, the component can be placed into a desiccator or dry-box.

20 Claims, 3 Drawing Sheets

OTHER PUBLICATIONS

Koda et al., "Hot Water Hydration of Porous Anodic Oxide Films on Aluminum and Acid-Dissolution of Hydrated Films Part 1, Analysis by Gravimetric Method", The Electrochemical Society, Inc., 1986, pp. 355-367 vol. 86-11, Analytical Chemistry Laboratory, Faculty of Engineering, Sapporo, Japan.

Mansfeld et al., "Software for Simulation and Analysis of Electrochemical Impedance Spectroscopy (EIS) Data", Computer Modeling in Corrosion, 1992, pp. 186-197, ASTM Pennsylvania.

Shih et al., "Passivation in Rare Earth Metal Chlorides—A New Conversion Coating Process for Aluminum Alloys", Corrosion Testing of Aluminum Alloys, 1992, pp. 180-195, ASTM Pennsylvania.

Shih et al., "Mathematical Modeling and Software for Anodic Coatings of Aluminum Alloys", Presentation on World Young Chemists, 2000, Xiemen China, Dec. 2000.

Shih et al., "Data Analysis of EIS in Corrosion Monitoring and Detection", Presentation on the $3^{rd}$ Asia International Corrosion Conference, 1994, pp. 1034-1-1034-21, Singapore, Sep. 1994.

Kaesche, "Metallic Corrosion", National Association of Corrosion Engineers, Texas, 1985.

Tajima, Anodic Oxidation of Aluminum, Advances in Corrosion Science and Technology, 1970, pp. 229-362, vol. 1, Plenum Press New York—London.

Wernick et al., "The Surface Treatment and Finishing of Aluminium and Its Alloys", $5^{th}$ Edition, vol. 1, 1987, ASM International.

Thompson et al., "Anodic Films on Aluminium", Treatise on Materials Science and Technology, 1983, pp. 205-329, vol. 23, Academic Press.

Diggle et al., "Anodic Oxide Films on Aluminum", Chem. Rev., 1969, pp. 365-405.

* cited by examiner

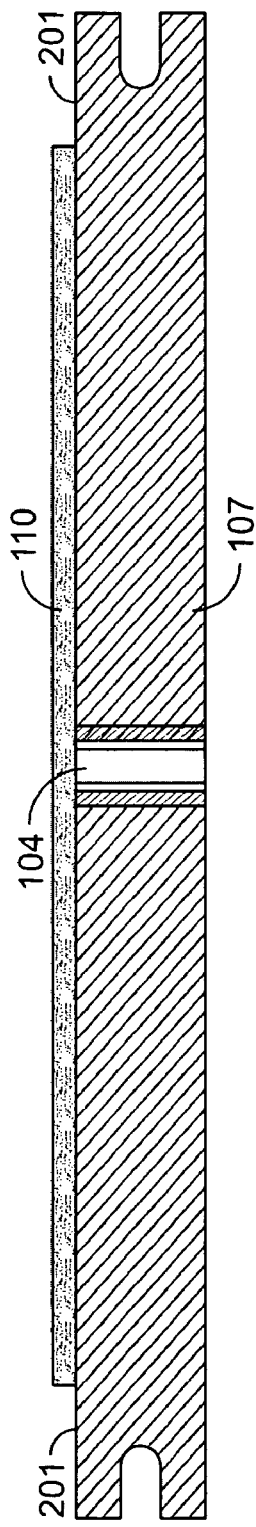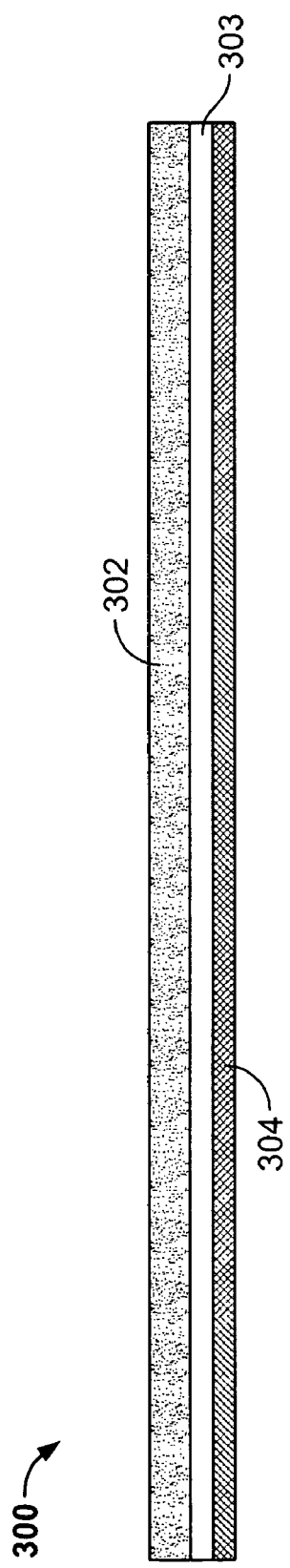
FIG. 2
FIG. 3A

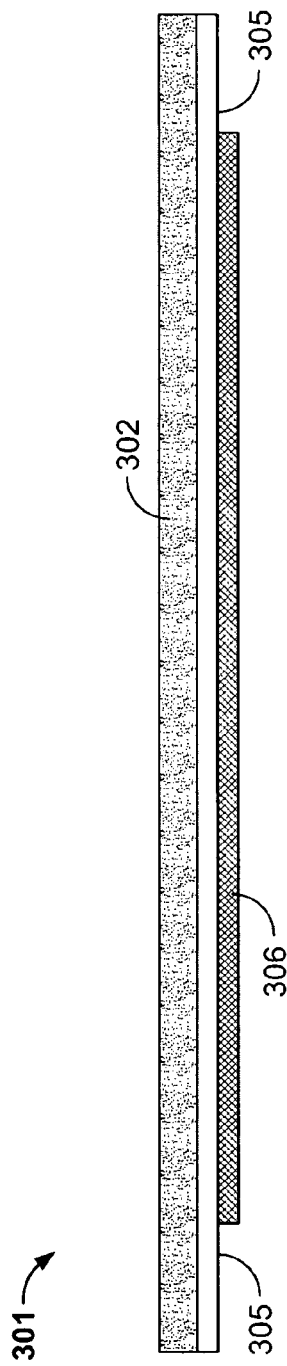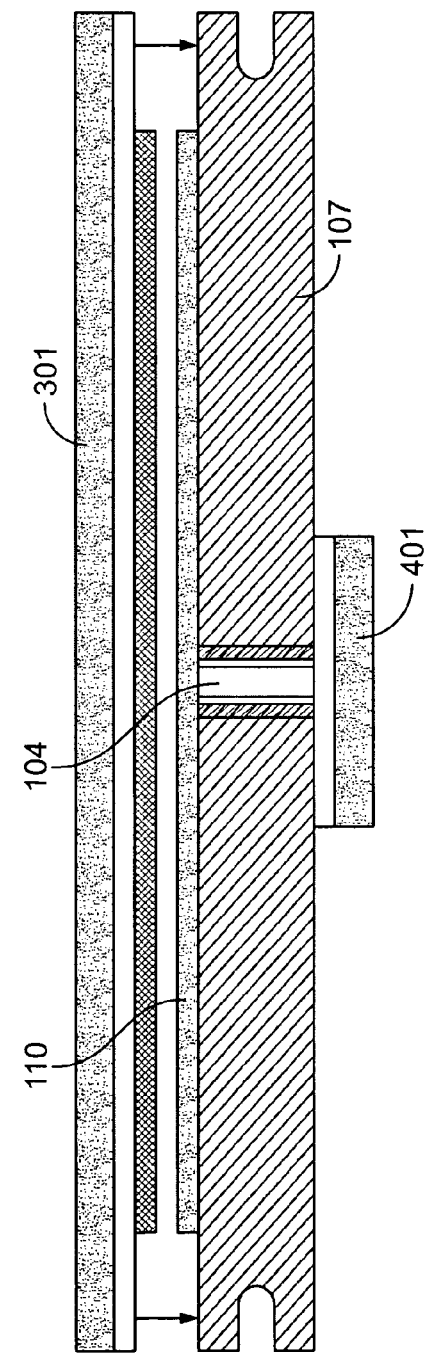

US 7,976,641 B1

EXTENDING STORAGE TIME OF REMOVED PLASMA CHAMBER COMPONENTS PRIOR TO CLEANING THEREOF

BACKGROUND

As semiconductor technology evolves, decreasing transistor sizes call for an ever higher degree of accuracy, repeatability and cleanliness in wafer processes and process equipment. Fierce competition within the semiconductor industry calls for ever lower cost per processed wafer. All of these requirements apply generally to all of the processing equipment used in the fabrication sequence.

Among the various types of equipment that exists for semiconductor processing is equipment that involves the use of plasmas, such as plasma etch, plasma-enhanced chemical vapor deposition (PECVD) and resist strip equipment. The types of equipment required for these processes include components which are located within the plasma chamber, and must function in that environment. The environment inside the plasma chamber may include exposure to the plasma and to etchant gasses, and materials used for such components are preferably adapted to withstand the environmental conditions in the chamber.

Generally, replacement of such components is expensive, and component lifetime as measured by the total number of wafers processed before replacement is needed is typically the denominator in the cost determination. Components with lifetimes that are considered low are therefore considered expensive and alternative solutions are generally sought. Conversely, methods which extend the lifetime of component parts are considered to lower their cost.

SUMMARY

A method of extending storage time of a removed component of a plasma chamber prior to cleaning thereof comprises removing the component from the chamber, covering a thermal spray coating on the component while the surface is exposed to atmospheric air, and storing the component. The covering allows extended storage of the component until a cleaning process is performed by removing the covering and cleaning reaction by-products from the thermal spayed coating.

In an embodiment, the covering can be a moisture impermeable material such as a polymer layer sealed to the surface of the component. In another embodiment, the component can be placed into a desiccator or dry-box and stored therein until a cleaning process such as wet cleaning is carried out.

BRIEF DESCRIPTION OF THE DRAWINGS

FIG. 2 depicts an enlarged view of a removed ceramic window positioned with the side normally facing the chamber upward.

FIG. 3 shows electroplating tape and its preparation for use on the ceramic window according to a preferred embodiment FIG. 4 shows the final configuration of the electroplating tape covering both the gas injector and the yttria coated side of the ceramic window.

DETAILED DESCRIPTION

Figure 1:
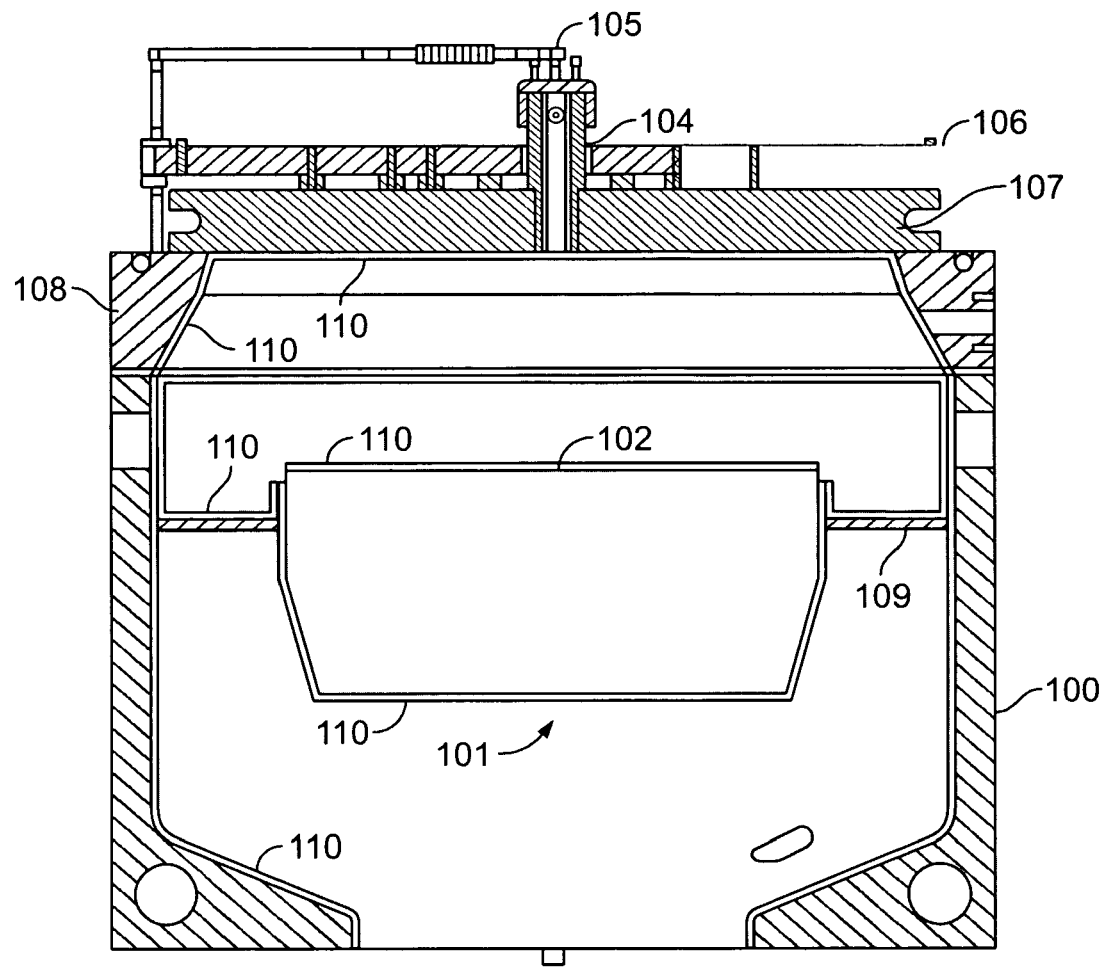
FIG. 1 depicts a schematic of a conductor etch plasma processing chamber including an yttria coated ceramic window.

Components used in semiconductor plasma processing chambers can be made from such materials as ceramic and anodized aluminum. Such components sustain physical and chemical attack from the plasma during normal processing conditions. In response to this requirement, components can be coated with an applied outer layer which provides protection from the kinds of chemicals, gasses and by-products of the plasma environment. One type of outer layer that can be applied is a thermal sprayed coating, e.g. a plasma sprayed coating which contains yttrium oxide, or yttria. An yttria-containing ("yttria") coating can provide low porosity levels, which serves to insulate the underlying substrate material from the aggressive environment of the plasma atmosphere. Other types of outer layers that can be applied include aluminum oxide, or alumina, cerium oxide or ceria, and the like.

One technique for depositing an yttria or alumina coating is thermal spraying, in which ceramic powder is melted and incorporated in a gas stream directed at the component being spray coated. One version of thermal spraying is plasma spraying, in which the coating material, usually in powder form, is injected into a high temperature plasma flame. The powder is heated rapidly, and when it comes in contact with the target substrate, cools rapidly to form the coating. Thermal spray yttria coatings can be formed directly on the substrate without having previously treated the substrate to promote adhesion. For example, yttria coatings can be applied directly to ceramic or metal components, e.g. quartz, alumina, anodized aluminum and the like.

An exemplary plasma reactor that can include components with thermal spray coatings such as yttria coatings is the Versys 2300™ etcher available from Lam Research Corporation of Fremont, Calif. As schematically shown in FIG. 1, the reactor comprises a reactor chamber 100 that includes a substrate support 101 including an electrostatic chuck 102, which provides a clamping force to a substrate such as a semiconductor wafer (not shown) mounted thereon. The substrate support 101 is typically made of anodized aluminum and can also be used to apply an RF bias to the substrate. The substrate can also be back-cooled using a heat transfer gas such as helium. In the Versys 2300™ etcher, processing gases are introduced into the chamber 100 via a gas injector 104 located on the top of chamber 100 and connected to a gas feed 105. The gas injector 104 is typically made of quartz or a ceramic material such as alumina. As shown, an inductive coil 106 can be powered by a suitable RF source (not shown) to provide a high density plasma. The inductive coil 106 couples RF energy through dielectric window 107 into the interior of chamber 100. The window 107 is typically made of a dielectric material such as quartz or alumina. The window 107 is shown mounted on an annular member 108, typically made of anodized aluminum. The annular member 108 spaces window 107 from the top of chamber 100. A chamber liner 109, typically made of anodized aluminum surrounds the substrate support 101. The chamber 100 can also include suitable vacuum pumping apparatus (not shown) for maintaining the interior of the chamber at a desired pressure.

In FIG. 1, selected internal surfaces of reactor components, such as the annular member 108, dielectric window 107, substrate support 101, chamber liner 109, gas injector 104 and the electrostatic chuck 102, are shown coated with a thermal sprayed coating such as an yttria coating 110. As shown in FIG. 1, selected interior surfaces of the chamber 100 and substrate support 101 below the chamber liner 109 can also be provided with a thermal sprayed coating such as an yttria coating 110. Any or all of these surfaces, as well as any other internal reactor surface, can be provided with a thermal sprayed coating such an yttria coating.

However, while a thermal sprayed yttria coating has low porosity, usually about 5%, and can protect the underlying material of the component from the effects of the plasma, the coating can lack sufficient integrity to prevent penetration of certain reactants. This is because a common feature of all thermal spray coatings is their lenticular or lamellar grain structure resulting from the rapid solidification of small globules, flattened from striking a cold surface at high velocities. While this creates a substantially strong covering in which mechanical interlocking and diffusion bonding occur, it can also create micro-fractures within the yttria coating. A poor yttria coating, for example, may have an open volume of 15%. This means that it can potentially allow chemicals to penetrate to the anodized aluminum substrate.

During plasma etch processes, etchant gasses are used as part of the plasma atmosphere. Some of the different plasma atmospheres for etch applications include chlorine-containing gasses, oxygen-containing gasses, and fluorine-containing gasses. Often, the chlorine-containing gasses are used in the aluminum etch process, fluorine-containing gasses are used in the silicon, silicon nitride and silicon dioxide etch processes, and oxygen-containing gasses are used in the polymeric etch or ash processes. In one kind of aluminum etch process, a structure may have photoresist, Ti or $TiO_2$, Al with 0.5% Cu SiON, $Si_3N_4$ and $SiO_2$. As the structure is processed in a plasma processing system, chlorine may react with aluminum to form aluminum chloride ($AlCl_3$), an inorganic by-product. This, in turn, can become suspended with organic material, $AlF_3$, $B_2O_3$, $SiO_2$, $TiF_4$, or photoresist in deposits that adhere to surfaces within the plasma processing system chamber. Such by-products are preferably periodically cleaned. For example, etch byproducts can be removed by contacting the component via wet cleaning using solutions of solvents and/or acids such as organic acids. Liquids having a suitably high solubility for metals can be used to remove such metals from the' component by the cleaning. Such metals may include Al, B, Ca, Cr, Cu, Fe, Li, Mg, Ni, K, Na, Ti and/or Zn. Suitable solvents that can be used for cleaning components to remove etch byproducts include, but are not limited to, nitric acid ($HNO_3$), hydrofluoric acid (HF), phosphoric acid ($H_3PO_4$), oxalic acid $(COOH)_2$, formic acid (HCOOH), hydrogen peroxide ($H_2O_2$), hydrochloric acid (HCl), acetic acid ($CH_3COOH$), citric acid ($C_6H_8O_7$), and mixtures thereof.

For the purpose of cleaning components as well as to ensure the proper continuing operation of the system, therefore, part of standard manufacturing maintenance procedures includes servicing of plasma etch chambers at regular intervals. During such times, the chamber is opened to atmospheric air and components may be removed for cleaning. Inter alia, an objective of the cleaning procedure is to remove etch by-products from their surface. This can be done using any known, standard wet cleans designed to remove etch by-products containing both organic and inorganic components.

However, it can be the case that a time delay of several days between the removal of the component from the chamber and its subsequent wet clean occurs. This time delay can occur when the resources required to operate the cleaning station are not available, or for other reasons. During this delay period, typically within 8 hours, peeling of a surface layer has been observed. It is herein speculatively suggested that the by-products on the component surface can interact with atmospheric air and produce a chemical reaction. In particular, for components such as those used in aluminum etch chambers or components having anodized layers, by-products can react with moisture in atmospheric air to form an acid. $AlCl_3$, for example, can react with $H_2O$ to form hydrochloric acid, HCl. A possible reaction is:

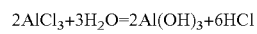

Subsequently, some of this ambient moisture, as well as the created hydrochloric acid, may diffuse through the thermal spray coating. For anodized aluminum components, the hydrochloric acid may possibly also diffuse through microcracks in the anodized aluminum layer to the substrate, where it may then react with the aluminum to generate hydrogen gas ($H_2$). A possible reaction is:

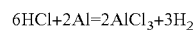

Additionally, the created aluminum chloride, may again react with moisture to form additional hydrochloric acid, starting the process again. As sufficient hydrogen gas is produced beneath the anodized aluminum layer, a gas pocket is formed. Eventually, hydrogen gas may create sufficient pressure to substantially damage the layers above it. That is, a blister may be formed that eventually causes the anodized aluminum and yttria layers to flake off or peel. Regardless of mechanism, peeling of a surface layer has been observed.

According to a preferred embodiment, thermal spray coated components of a plasma chamber are covered with a removable material such as a substantially moisture impermeable polymer sheet capable of being sealed (such as electroplating tape) to the component after removal of the component from the chamber, and maintaining such material securely in place on the components until such time as the components can be cleaned such as by wet cleaning in a process in which the reaction by-products are generally removed.

Still another embodiment is to place thermal spray coated components of a plasma chamber into a desiccator or a drybox with an inert gas such as nitrogen or argon, or dry air blowing through it, and storing the components within the desiccator or dry-box until such time as the components can be cleaned in a process in which the reaction by-products are generally removed. The desiccator can be any sealed container with a desiccant such as a box, jar or bag.

It is contemplated to cover thermal spray coated components of a plasma chamber with a substance consisting of a substantially moisture impermeable solution, gel, paste or foam, and maintaining the substance securely in place on the components until such time as the components can be cleaned in a process in which the reaction by-products are generally removed. It is contemplated that such a substance might be applied as an aerosol.

It is additionally contemplated that a substance used to cover thermal spray coated components of a plasma chamber may consist of a substantially moisture absorbing solution, gel, paste, fabric or foam.

The following detailed examples describe processes to extend the storage time of an yttria coated ceramic window upon removal from a plasma processing chamber after use according to preferred embodiments. They are intended to be illustrative rather than exclusionary, since numerous modifications and variations will be apparent to those skilled in the art.

Example 1

A schematic illustration of a Versys 2300™ conductor etch plasma chamber as shown in FIG. 1 is available from Lam Research Corporation in Fremont, Calif. FIG. 2 shows the yttria coated ceramic window 107 coating-side up. The yttria coating 110 does not cover an outer ring-shaped area referred to as the ceramic sealing surface 201. FIG. 3 shows electroplating tape 300, such as 2 mil Green Polyester Tape, part # VGT 215 available from Advanced Paper Systems of San Jose, Calif., which consists of a substantially moisture impermeable material 302, an adhesive layer 303, and an adhesive cover layer 304.

Procedurally, the tape 300 is prepared by cutting, such that it is substantially the same dimension as the ceramic window 107. It is further prepared such that a ring-shaped adhesive portion 305 which is to be positioned over the ceramic sealing surface 201 is exposed by removing the adhesive cover in that region. A remaining disk-shaped adhesive portion which is to be positioned over the yttria coating remains covered by the adhesive cover 306. A schematic of the prepared tape 301 in cross section is shown in FIG. 3b. The prepared tape 301 should be prepared before the chamber is opened.

Immediately after opening the chamber 100 and removing the ceramic window 107, while it is still hot as a result of prior plasma etch operation of the reactor, additional electroplating tape 401 is used to seal the gas injector 104 from the ceramic side, shown in FIG. 4. The tape 401 is positioned such that substantially all of the trapped air below the tape is removed. Also shown in FIG. 4, the prepared tape 301 is then applied to the ceramic window such that any trapped air at the sealing surface between the ceramic and the electroplating tape is removed. The ring-shaped region of the exposed adhesive 305 is then forced into intimate contact with the ring-shaped ceramic sealing surface 201. In this way, a substantially airtight seal is achieved at the periphery of the yttria coated ceramic window, preventing exposure of the surface of the yttria to atmospheric air.

Both the prepared and the additional electroplating tape are preferably applied shortly after removing the ceramic window from the chamber. It is recommended that the application of the prepared and the additional electroplating tape is accomplished within five minutes of removing the ceramic window from the chamber, or while the ceramic window is still above 50° C. Speculatively, moisture absorption from the atmospheric air takes place substantially after the component has cooled. Regardless of mechanism, the electroplating tape-sealed yttria-coated ceramic window is then placed into double packaging bags in preparation for cleaning.

Example 2

Similar to example 1, the tape 300 is sized by cutting such that it is substantially the same dimension as the ceramic window 107. The tape 300 should be sized before the chamber is opened.

Immediately after opening the chamber 100 and removing the ceramic window 107, while it is still hot as a result of prior plasma etch operation of the reactor, additional electroplating tape 401 is used to seal the gas injector 104 from the ceramic side, shown in FIG. 4. The tape 401 is positioned such that substantially all of the trapped air below the tape is removed.

With the window 107 positioned such that the yttria coating 110 is facing upwards, cleanroom wipes are used to cover the coating 110 without covering the ceramic sealing surface 201. An example of cleanroom wipes that can be used for this purpose are Cleanroom Polyester/Cellulose Blend Wipers, Spec-Wipe™ 3 available from VWR International, Inc., West Chester, Pa. Alternatively, a plastic sheet could be used. The annular section of adhesive cover 304 is then completely removed from tape 300 and the central portion of the tape 300 without cover is applied to the ceramic window such that any trapped air at the sealing surface between the ceramic and the electroplating tape is removed. The annular section of exposed adhesive is then forced into intimate contact with the ring-shaped ceramic sealing surface 201 as well as the wipes covering the yttria coating 110. In this way, a substantially airtight seal is achieved at the periphery of the yttria coated ceramic window, preventing exposure of the surface of the yttria to atmospheric air. Further, the exposed adhesive is prevented from coming into contact with the yttria coating so as to minimize damaging the coating.

The present invention has been described with reference to preferred embodiments. However, it will be readily apparent to those skilled in the art that it is possible to embody the invention in specific forms other than as described above without departing from the spirit of the invention. The preferred embodiment is illustrative and should not be considered restrictive in any way. The scope of the invention is given by the appended claims, rather than the preceding description, and all variations and equivalents which fall within the range of the claims are intended to be embraced therein.

What is claimed is:

1. A method of extending storage time prior to cleaning a component of a plasma chamber, the method comprising:
   removing the component from the chamber wherein the component has undergone a plasma operation during which reaction by-products were deposited on a thermal spray coating of the component;
   covering a surface of the thermal spray coating on the component with a substantially impermeable adhesive polymer sheet, and wherein the substantially impermeable adhesive polymer sheet is applied outwardly of a periphery of the surface of the thermal spray coating to prevent exposure of the surface of the thermal spray coating to atmospheric air; and
   storing the component for later cleaning of the reaction by-products from the thermal spray coating.

2. The method of claim 1, wherein the substantially impermeable adhesive polymer sheet is a moisture impermeable material.

3. The method of claim 1, wherein covering the thermal spray coating of the component is accomplished within 5 minutes from exposing the chamber and components to atmospheric air.

4. The method of claim 1, wherein the component is removed at a temperature above 50° C. and the polymer sheet is applied while the component is at a temperature above 50° C.

5. The method of claim 1, wherein the thermal spray coating consists essentially of yttria.

6. The method of claim 1, wherein the thermal spray coating consists essentially of alumina.

7. The method of claim 1, wherein the thermal spray coating is on an underlying material selected from the group consisting of aluminum, anodized aluminum, alumina and a ceramic.

8. The method of claim 1, wherein the plasma chamber is a plasma etch chamber.

9. The method of claim 1, wherein the component is stored for at least 4 hours.

10. The method of claim 1, further comprising:
    removing the polymer sheet from the thermal spray coating; and
    performing a wet cleaning process in which the reaction by-products are removed from the thermal spray coating.

11. The method of claim 1, further comprising cleaning the reaction by-products from the thermal spray coating without removing the thermal spray coating and reinstalling the component in the chamber.

12. The method of claim 1, further comprising:
    removing the polymer sheet from the thermal spray coating;

cleaning the component without removing the thermal spray coating; and reinstalling the component in a second plasma chamber.

13. The method of claim 1, wherein the component comprises a dielectric window.

14. The method of claim 1, wherein the component comprises a baffle.

15. The method of claim 1, wherein the component is selected from the group consisting of: electrostatic chucks, disks, rings, liners, injectors, substrate supports, and gas distribution plates.

16. The method of claim 1, further comprising applying the substantially impermeable adhesive polymer sheet outwardly of the periphery of the thermal spray coating without contacting the thermal spray coating.

17. A method of extending storage time prior to cleaning a component of a plasma etch chamber, the method comprising:

removing the component from the chamber wherein the component has undergone a plasma operation during which reaction by-products were deposited on a thermal spray coating of the component;

covering the thermal spray coated component of the plasma etch chamber with a moisture impermeable material while exposed to atmospheric air to prevent plasma reaction by-products from reacting with moisture in the atmospheric air;

sealing the moisture impermeable material outwardly of a periphery of the thermal spray coating to prevent exposure of the surface of the thermal spray coating to atmospheric air;

storing the thermal spray coated component for at least one day with the moisture impermeable material for later cleaning of the reaction by-products from the thermal spray coating;

removing the covering from the thermal spray coating; and performing a wet cleaning process in which the reaction by-products are removed from the thermal spray coating without removing the thermal spray coating.

18. The method of claim 17, wherein the covering is applied on the thermal spray coated component while the thermal spray coated component is at a temperature above 50° C. from a plasma etch operation.

19. A method of extending storage time prior to cleaning a component of a plasma etch chamber, the method comprising:

performing a plasma etch operation during which etch by-products are deposited on a thermal spray coating on the component;

removing the component from the chamber;

covering the thermal spray coating on the component with a moisture impermeable material, and wherein the moisture impermeable material is applied outwardly of a periphery of the thermal spray coating to prevent the etch by-products from reacting with moisture in the atmospheric air;

storing the component for later cleaning of the etch by-products from the thermal spray coating;

removing the covering from the thermal spray coating; and performing a wet cleaning process in which the etch by-products are removed from the thermal spray coating.

20. A method of extending storage time prior to cleaning a component of a plasma chamber, the method comprising:

removing the component from the chamber wherein the component has undergone a plasma operation during which reaction by-products were deposited on a thermal spray coating of the component;

covering a surface of the thermal spray coating on the component with electroplating tape, which adheres to surfaces of the component not covered with the thermal spray coating while not adhering the tape to the thermal spray coating; and storing the component for later cleaning of the reaction by-products from the thermal spray coating.

* * * * *